(12) United States Patent
Takahashi

(10) Patent No.: US 9,750,137 B2
(45) Date of Patent: Aug. 29, 2017

(54) SEMICONDUCTOR DEVICE

(71) Applicant: FUJI ELECTRIC CO., LTD., Kawasaki-shi (JP)

(72) Inventor: Hideaki Takahashi, Omachi (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/181,503

(22) Filed: Feb. 14, 2014

(65) Prior Publication Data
US 2014/0254116 A1   Sep. 11, 2014

(30) Foreign Application Priority Data

Mar. 8, 2013  (JP) ................................. 2013-046277

(51) Int. Cl.
*H05K 1/18*  (2006.01)
*H01L 25/16*  (2006.01)
*H01L 23/053*  (2006.01)

(52) U.S. Cl.
CPC ............. *H05K 1/18* (2013.01); *H01L 23/053* (2013.01); *H01L 25/162* (2013.01); *H01L 2224/48091* (2013.01); *H01L 2224/49175* (2013.01); *H01L 2924/1305* (2013.01); *H01L 2924/13055* (2013.01); *H01L 2924/13091* (2013.01)

(58) Field of Classification Search
CPC ....... H05K 1/18; H01L 23/053; H01L 25/162; H01L 2924/1305; H01L 2924/13055; H01L 2924/13091; H01L 2224/49175; H01L 2224/48091; H01L 2924/00014; H01L 2924/00

USPC ....... 361/600, 715, 728, 729, 730, 748, 752, 361/753, 790, 797, 760, 772, 773, 800; 257/690, 691, 692, 777, 778

See application file for complete search history.

(56) References Cited

U.S. PATENT DOCUMENTS

| | | | |
|---|---|---|---|
| 5,497,291 A * | 3/1996 | Hosen ......................... | 361/804 |
| 6,144,571 A * | 11/2000 | Sasaki et al. ................. | 363/144 |
| 6,421,244 B1 | 7/2002 | Shinohara et al. | |
| 6,509,629 B2 * | 1/2003 | Yoshimatsu et al. ......... | 257/660 |
| 6,521,983 B1 * | 2/2003 | Yoshimatsu et al. ......... | 257/678 |
| 6,717,258 B2 * | 4/2004 | Ishii et al. .................... | 257/691 |
| 7,035,081 B2 * | 4/2006 | Nagata ............. | H01L 23/49822 257/200 |

(Continued)

FOREIGN PATENT DOCUMENTS

| JP | 8-204120 | 8/1996 |
|---|---|---|
| JP | H08-204120 A | 8/1996 |

(Continued)

*Primary Examiner* — Steven T Sawyer
*Assistant Examiner* — Sagar Shrestha
(74) *Attorney, Agent, or Firm* — Rabin & Berdo, P.C.

(57) ABSTRACT

A control terminal of an intelligent power module has a structure in which it is possible to reduce the area used exclusively by the module. An insulating circuit substrate on which power semiconductor elements are mounted, and a printed substrate having a control circuit, are arranged in a tiered structure, and a structure is adopted in which control terminals through which input control signals into a control substrate, as well as being formed into a linear shape, are caused to stand upright by being inserted into control terminal insertion holes provided in a case bottom portion of a module and the through holes of the printed substrate.

5 Claims, 9 Drawing Sheets

(56) References Cited

U.S. PATENT DOCUMENTS

| | | | |
|---|---|---|---|
| 7,706,146 B2* | 4/2010 | Lee et al. ................... 361/752 | |
| 8,102,670 B2* | 1/2012 | Sakamoto .............. H05K 1/144 | |
| | | | 361/792 |
| 2001/0038143 A1 | 11/2001 | Sonobe et al. | |
| 2003/0015778 A1* | 1/2003 | Soyano ................ H01L 23/045 | |
| | | | 257/678 |
| 2004/0169198 A1* | 9/2004 | Nagata ............. H01L 23/49822 | |
| | | | 257/200 |
| 2007/0257564 A1* | 11/2007 | Kitade ................... H02K 41/03 | |
| | | | 310/12.23 |
| 2007/0284947 A1 | 12/2007 | Lee et al. | |
| 2009/0096081 A1 | 4/2009 | Soyano | |
| 2009/0102040 A1* | 4/2009 | Specht et al. ................. 257/690 | |
| 2009/0257209 A1* | 10/2009 | Han ....................... H05K 1/112 | |
| | | | 361/772 |
| 2012/0074542 A1 | 3/2012 | Soyano | |
| 2012/0181682 A1* | 7/2012 | Soyano ........................ 257/692 | |
| 2016/0343755 A1* | 11/2016 | Karashima .............. H01L 23/40 | |

FOREIGN PATENT DOCUMENTS

| | | |
|---|---|---|
| JP | H11-68035 A | 3/1999 |
| JP | 2000-068446 A | 3/2000 |
| JP | 2003-324184 A | 11/2003 |
| JP | 2012-129336 A | 7/2012 |
| JP | 2012-527095 A | 11/2012 |

* cited by examiner

SEMICONDUCTOR DEVICE

BACKGROUND OF THE INVENTION

1. Field of the Invention

The present invention relates to a semiconductor device, and particularly to a power module on which power semiconductor elements are mounted.

2. Description of the Background Art

A semiconductor device called a power module, used for power control in an inverter or the like, on which are mounted a plurality of power semiconductor elements such as insulated gate bipolar transistors (IGBTs), power MOSFETs, or free wheel diodes (FWDs), is being widely used in the industrial field.

In general, a power module has a structure in which power semiconductor elements which convert power are mounted on an insulating circuit substrate in which a main circuit pattern is embedded, and mounted on a metal base plate for heat release, and furthermore, the outer periphery of the metal base plate is covered with a resin case.

Also, a semiconductor device called an intelligent power module (IPM), in which various kinds of control functions are added to the power module, incorporates therein an insulating circuit substrate for a main circuit, and in addition, a printed substrate having a control element and control circuit pattern.

In the IPM, a structure of two separate tiers of the insulating circuit substrate and printed substrate is generally adopted, and it is necessary to electrically connect the two substrates, the substrates and external terminals, and the like. Because of this, inside the device, an electrical connection is performed using metal plates called lead frames, bonding wires, any kind of soldering material, or the like, thus establishing a circuit necessary for the semiconductor device to function normally. Further, control signals supplied from the exterior of the IPM through control terminals are supplied to a control circuit in the IPM, thus driving the power semiconductor elements of the main circuit based on signals output from the control circuit, and it is thereby possible to carry out effective power control.

With regard to control signal internal wiring of the IPM, a technology described in JP-A-11-68035 and JP-A-2000-68446 is heretofore known. Details will be described hereafter.

FIG. 6 is a sectional view of a heretofore known IPM 100. An insulating circuit substrate 112 is placed on a metal base plate 111, and furthermore, power semiconductor elements 113 are placed on the insulating circuit substrate 112. A resin case 120 molded integrally with control terminals 130 and connecting terminals 131a and 131b is placed on the metal base plate 111 so as to surround the insulating circuit substrate 112.

The power semiconductor elements 113 are each furnished with main circuit wiring and control wiring using bonding wires or the like, and are connected to a printed substrate 150 using bonding wires 140 and the connecting terminals 131a and 131b as the control wiring, of the two wirings.

Furthermore, the control wiring between the printed substrate 150 and the exterior of the IPM is carried out using the U-shaped control terminals 130. The control terminals 130 are configured so as to be embedded in a case sidewall 120a. The inner portion of the IPM 100 is sealed with an insulating gel (not shown) or the like, and a cover 160 for foreign matter exclusion is placed on the upper portion of the IPM 100.

Next, a description will be given of a method of manufacturing the IPM 100. Firstly, the power semiconductor elements 113 are mounted on the insulating circuit substrate 112 using a solder or the like, and furthermore, mounted on the metal base plate 111 using a solder or the like.

Meanwhile, the control terminal 130 and connecting terminals 131a and 131b, each processed from a metal plate into a predetermined shape, are set in a mold tool, and insert molding is carried out, thereby forming the case 120. The molded case 120 is mounted using an adhesive or the like so as to surround the insulating circuit substrate 112 on the metal base plate 111. In this condition, the connecting terminals 131a and 131b and power semiconductor elements 113 are connected by the bonding wires 140.

A plan view at this stage is shown in FIG. 7, and a sectional view along the line VIII-VIII' of FIG. 7 is shown in FIG. 8. As shown in FIG. 7, the connecting terminals 131a and 131b are provided on two respective opposite sides, of four peripheral sides of the case 120, and the control terminals 130 are provided on one side.

Subsequently, the printed substrate 150 is mounted so that the control terminals 130 and connecting terminals 131a and 131b are inserted into through holes provided in the printed substrate 150. Furthermore, by, for example, soldering the connections of the through holes and their respective terminals, the electrical connection between the printed substrate 150 and each terminal is secured, and the printed substrate 150 is fixed in the IPM 100.

Finally, the insulating gel (not shown) is injected into the inner portion, and the cover 160 is mounted using an adhesive or the like, thereby completing the IPM 100.

With regard to the main circuit wiring of the IPM 100, various kinds of wires are furnished with so as to be led out to the exterior of the IPM, in the same way as with the control wiring, but an illustration and description are omitted here.

However, as a result of an earnest investigation by the present inventor, it is revealed that the IPM of the heretofore known structure has various problems. Details will be described hereafter.

An IPM is eventually used by being incorporated inside each kind of device necessary for power control, but when the area used exclusively by the IPM is large, a device in which the IPM is incorporated also increases in size, meaning that a further reduction in the size of the IPM has been strongly demanded in recent years. Meanwhile, the case sidewall 120a has to hold the control terminals 130 using insert molding, and it is not possible to make the thickness of the case side wall 120a smaller than a thickness enough to be able to hold the control terminals 130. Also, as the control terminals 130 are disposed on the case sidewall 120a, as shown in FIG. 6, wiring extending in a horizontal direction from the printed substrate 150 is necessary, but it is also necessary to secure a space for this extension wiring. It has thus been revealed that the necessity of the sidewall thickness and horizontal wiring prevents a reduction in the area used exclusively by the IPM.

Furthermore, as there exists no standard relating to positions on the IPM in which the control terminals are mounted, it is necessary to mount the control terminals 130 in different positions required depending on use applications. Meanwhile, as the control terminals 130 are mounted on the case 120 by insert molding, as previously described, it is necessary to prepare various kinds of insert molding tools corresponding to the different mounting positions of the control terminals 130. In this way, the necessity of preparing various kinds of mold tools leads to an increase in the manufacturing cost of the IPM.

SUMMARY OF THE INVENTION

The invention, having been contrived bearing in mind these kinds of points, has an object of providing a semiconductor device in which it is possible to reduce the area used exclusively by an IPM, and furthermore, it is possible to provide different positions in which are mounted control terminals without preparing various kinds of mold tools.

In order to achieve the object, one aspect of the invention is a semiconductor device including power semiconductor elements; an insulating circuit substrate on which the power semiconductor elements are placed; a printed substrate, electrically connected to the power semiconductor elements, which has a control circuit; a case having control terminal insertion holes in the bottom portion thereof; and control terminals which electrically connect the printed substrate and the exterior of the semiconductor device. A configuration is such that the printed substrate has a tiered structure with the insulating circuit substrate and case bottom portion, and the control terminals, having a linear shape, are inserted in the control terminal insertion holes and the through holes of the printed substrate.

According to the semiconductor device of the aspect, the structure in which the linearly shaped control terminals are caused to stand upright by being inserted in the control terminal insertion holes provided in the case bottom portion and the through holes of the printed substrates is adopted, thereby eliminating the need for the resin thickness, of a case sidewall of the previously described heretofore known structure, enough to hold the insert molded control terminals, and it is possible to reduce the thickness of the sidewall. Also, as horizontal extension wiring for connecting the control terminals and printed substrate, which has been needed in the heretofore known structure, is also no longer necessary, it is also no longer necessary to secure a space for the extension wiring. Because of these, it is possible to reduce the area used exclusively by the IPM.

DETAILED DESCRIPTION OF THE INVENTION

Hereafter, a description will be given, based on the drawings, of a preferred embodiment (working example) of the invention.

The same components will be given the same reference signs throughout the embodiment, and a redundant description will be omitted.

The working example, not being limited to the described embodiment, can be changed into various forms without departing from the scope of the technical idea shown in the claims.

Figure 1:
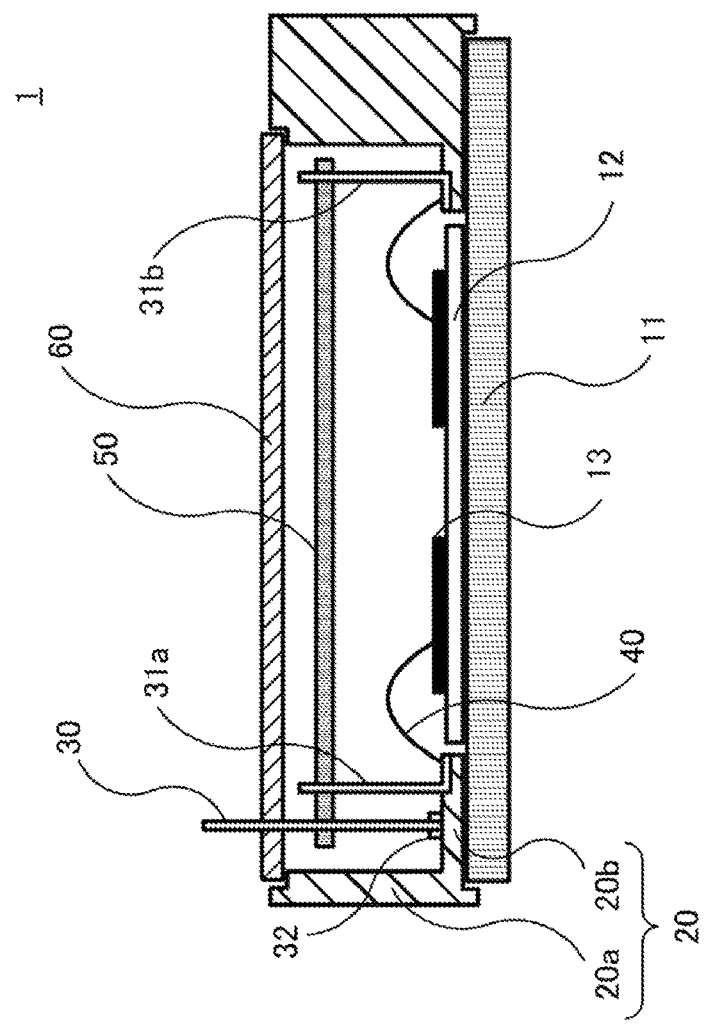
FIG. 1 is a sectional view of a semiconductor device according to a working example of the invention.

FIG. 1 is a sectional view of an IPM 1 which is a semiconductor device according to the working example of the invention. A description will be given hereafter of a configuration of the device.

An insulating circuit substrate 12 is placed on a metal base plate 11 configured from a high thermal conductive metal such as copper or aluminum. Herein, the insulating circuit substrate 12 is configured so that a metal thin film made of copper or the like is bonded to the lower surface of an insulating plate formed from insulating and high thermal conductive ceramics, such as alumina or silicone nitride, or the like, and a metal thin film, made of copper, on which is provided an electric circuit pattern for a main circuit is bonded to the upper surface of the insulating plate. The insulating circuit substrate 12 is also called a direct copper bonding (DCB) substrate or a metal insulating substrate.

Power semiconductor elements 13, such as IGBTs, power MOSFETs, or FWDs, are placed on the electric circuit pattern thin film of the insulating circuit substrate 12.

Also, a resin case 20 molded integrally with metal connecting terminals 31a and 31b is placed on the metal base plate 11 so that the insulating circuit substrate 12 is surrounded by a case bottom portion 20b. The insulating circuit substrate 12 and case bottom portion 20b, as both of them are placed on the metal base plate 11, are disposed on substantially the same level.

The power semiconductor elements 13 are each furnished with main circuit wiring and control wiring using bonding wires, lead frames, or the like, and are connected to a printed substrate 50 using bonding wires 40 and the connecting terminals 31a and 31b as the control wiring, of the two wirings.

As shown in FIG. 1, the printed substrate 50 is disposed on a level different from that of the insulating circuit substrate 12 and case bottom portion 20b, that is, they have a tiered structure. This is because it is possible to reduce the area used exclusively by the IPM as compared with when the printed substrate 50 is disposed on the same level as that of the insulating circuit substrate 12.

Control semiconductor elements and passive elements (not shown) are fixed to a surface of the printed substrate 50, and these parts are connected by electric wiring. Also, in order to enable the electrical connection between the electric wiring and various kinds of terminals, through holes whose inner walls are subjected to a conductive treatment are provided in portions corresponding to the various kinds of terminals.

The control wiring between the printed substrate 50 and the exterior of the IPM 1 is carried out using linearly shaped control terminals 30. The control terminals 30 are held by being inserted in control terminal insertion holes 32 provided in the bottom portion 20b of the case 20 and the through holes of the printed substrate 50.

Furthermore, the inner portion of the IPM 1 is sealed with an insulating gel (not shown) or the like, and a cover 60 for foreign material exclusion or the like is placed on the upper portion of the IPM 1.

The structure in which the linearly shaped control terminals 30 are caused to stand upright by being inserted in the control terminal insertion holes 32 provided in the case bottom portion 20b and the through holes of the printed substrate 50 in this way is adopted, thereby eliminating the need for the resin thickness of a case sidewall 20a enough to hold the insert molded control terminals, thus enabling a reduction in the thickness of the case sidewall 20a. Also, as horizontal extension wiring for connecting the control terminals and printed substrate, which has been needed in a heretofore known structure, is also no longer necessary, it is also no longer necessary to secure a space for the extension wiring. Because of these, it is possible to reduce the area used exclusively by the IPM as compared with in the heretofore known structure.

It is more effective to cause the control terminals 30 to stand vertically from the case bottom portion 20b because it is thereby possible to minimize the area used exclusively by the IPM 1 as compared with when the control terminals are caused to stand on a slant or formed into a bent shape.

Figure 2:
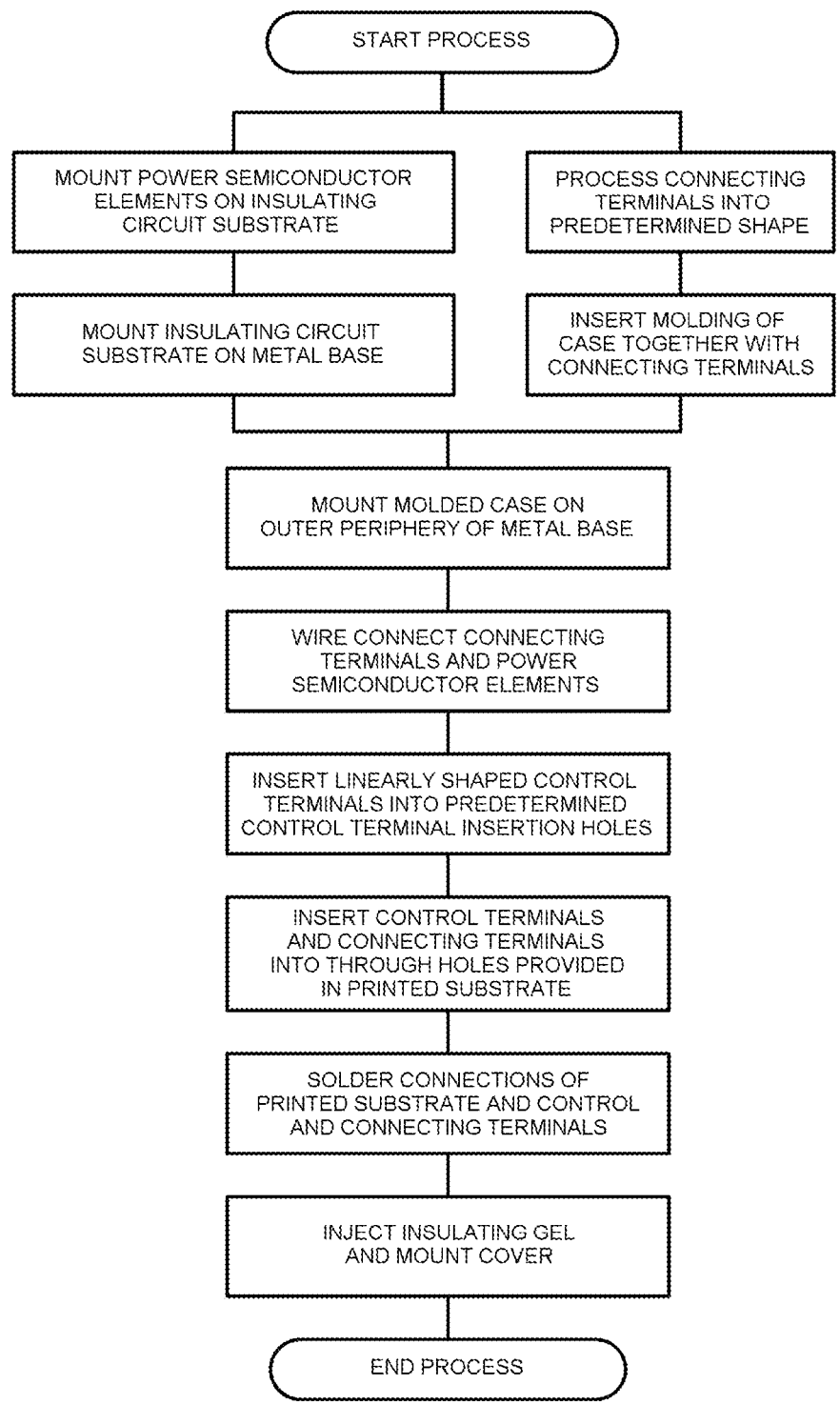
FIG. 2 is a manufacturing flow diagram of the semiconductor device according to the working example of the invention.

Subsequently, a description will be given of a method of manufacturing the IPM 1. FIG. 2 is a manufacturing flow diagram of the IPM 1 according to the working example of the invention. Details will be described hereafter.

Firstly, the power semiconductor elements 13 are mounted on the electric circuit pattern thin film of the insulating circuit substrate 12 by soldering or the like. The reason for using soldering here is to secure the electrical connection between the power semiconductor elements 13 and the electric circuit pattern thin film of the insulating circuit substrate 12.

Furthermore, the insulating circuit substrate 12 on which are mounted the power semiconductor elements 13 is mounted on the metal base plate 11 by soldering or the like. The reason for using soldering here is to effectively release heat, generated from the power semiconductor elements 13 when the IPM operates, to the metal base plate 11.

Meanwhile, the connecting terminals 31a and 31b, processed from a metal plate into a predetermined shape, are set in a mold tool, and insert molding is carried out, thereby forming the case 20. The control terminal insertion holes 32 are also molded in the case bottom portion 20b simultaneously with the insert molding.

The molded case 20 is mounted in a position on the metal base plate 11, in which the case bottom portion 20b surrounds the insulating circuit substrate 12, using an adhesive or the like.

In this condition, the connecting terminals 31a and 31b and power semiconductor elements 13 are connected by the bonding wires 40 configured from aluminum, copper, or the like. Furthermore, the linearly shaped metal control terminals 30 are mounted by being press fitted into the control terminal insertion holes 32 in predetermined positions. A plan view at this stage is shown in FIG. 3, and a sectional view along the line IV-IV' of FIG. 3 is shown in FIG. 4.

Figure 3:
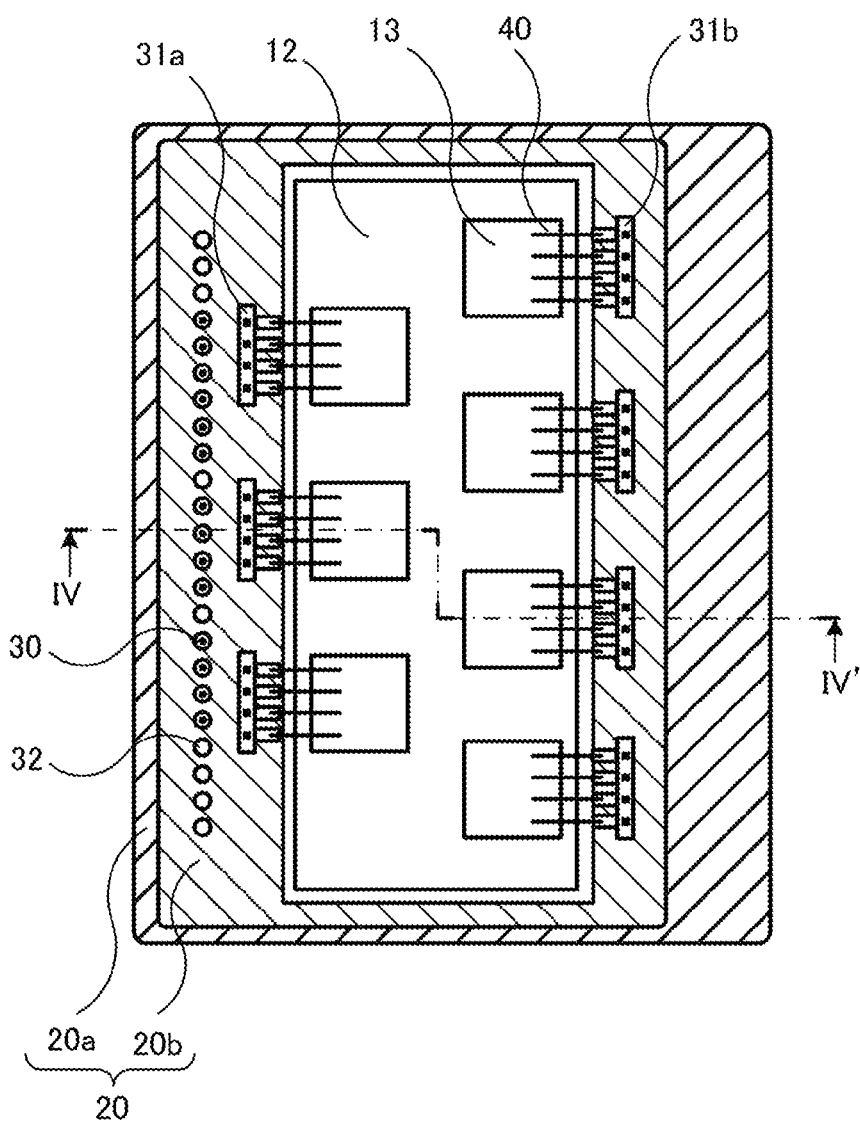
FIG. 3 is a plan view of the semiconductor device according to the working example of the invention at a manufacturing stage.
Figure 4:
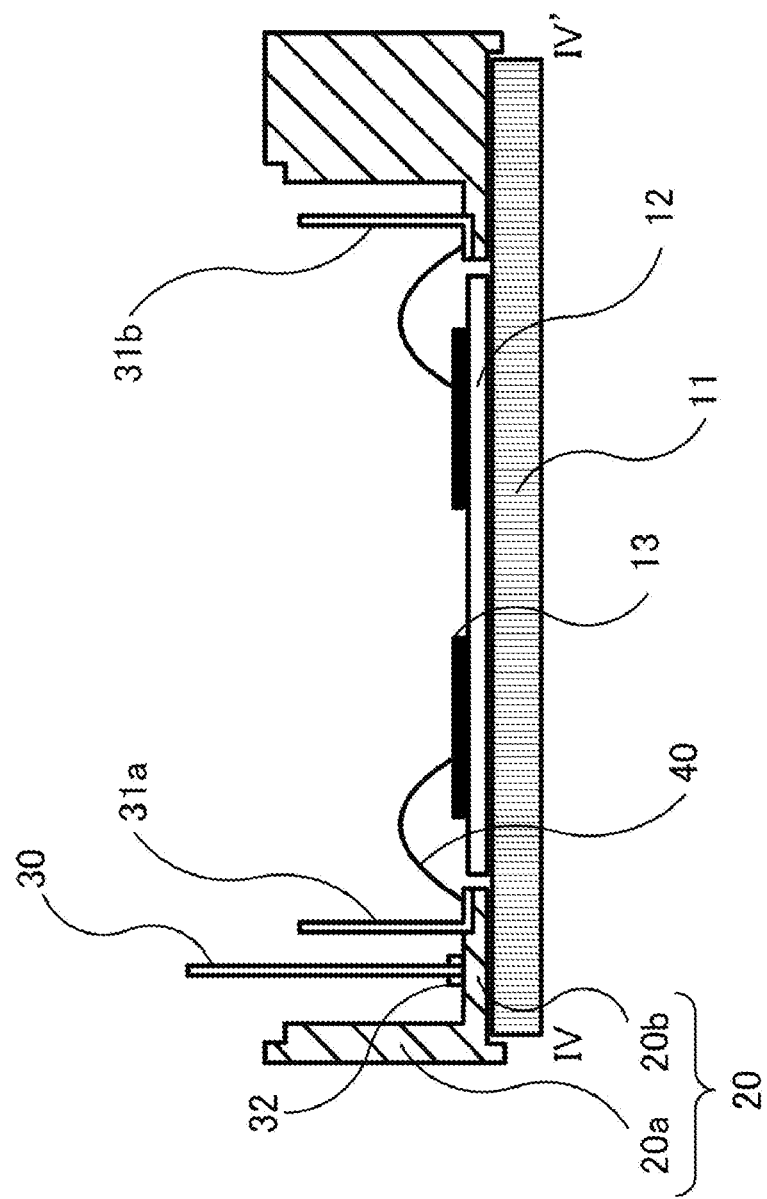
FIG. 4 is a sectional view of the semiconductor device according to the working example of the invention at the manufacturing stage.

As shown in FIG. 3, the connecting terminals 31a and 31b are provided on two respective opposite sides, of four peripheral sides of the case 20. Also, a large number of the control terminal insertion holes 32 are prepared in advance at equal pitches on one side, and the control terminals 30 are mounted in holes, of the control terminal insertion holes 32, corresponding to positions on the IPM appropriate to their respective use applications.

Subsequently, the printed substrate 50 is mounted so that the control terminals 30 and connecting terminals 31a and 31b are inserted into the through holes provided in the printed substrate 50. Furthermore, by, for example, soldering the connections of the through holes and their respective terminals, the electrical connection between the printed substrate 50 and each terminal is secured, and the printed substrate 50 is fixed in the IPM 1.

Finally, the insulating gel (not shown) is injected into the inner portion, and the cover 60 is mounted, thereby completing the IPM 1. In the same way as in the previously described heretofore known technology, with regard to the main circuit wiring of the IPM 1 too, various kinds of wires are furnished with so as to be led out to the exterior, but an illustration and description are omitted here.

By enabling the mounting by preparing in advance the large number of control terminal insertion holes 32 at equal pitches, and press fitting the control terminals 30 into the holes corresponding to their respective necessary positions on the IPM, in this way, it is possible to optionally set the combination of the terminal pitches and dispositions of the control terminals 30. Because of this, there is an advantage that it is no longer necessary to prepare various kinds of case molding tools depending on a large number of uses, and that the degree of freedom of mounting the IPM on an external device also increases.

Also, when attempting to mount the control terminals on the insulating circuit substrate, the printed substrate, or the surface of the metal base plate, it is necessary to fix the end portions of the control terminals using a solder or adhesive, but in the invention, as the technique of fixing the end portions by press fitting the control terminals into the control terminal insertion holes is employed, man-hours decrease as compared with when using a solder or adhesive, meaning that it is also possible to obtain a cost reduction effect.

Figure 5A:
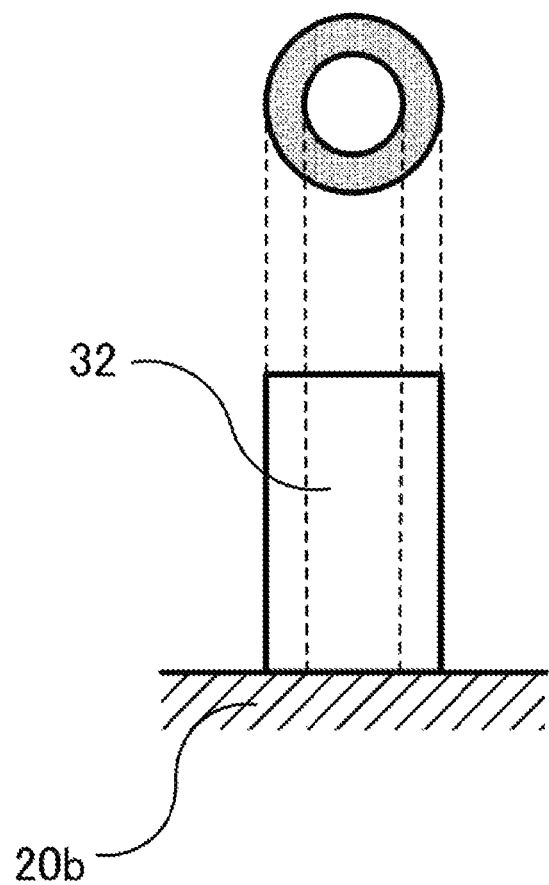
FIGS. 5A and 5B are a plan view and sectional view of control terminal insertion holes according to the working example of the invention.
Figure 5B:
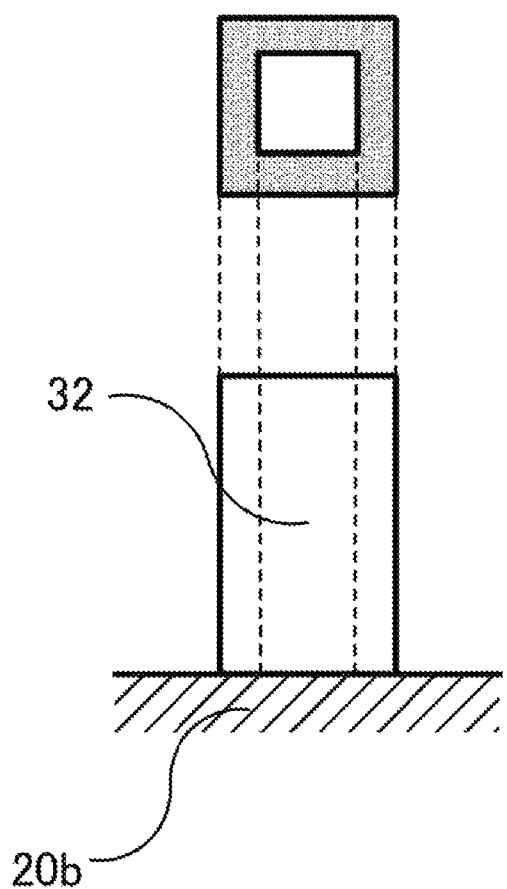
Figure 6:
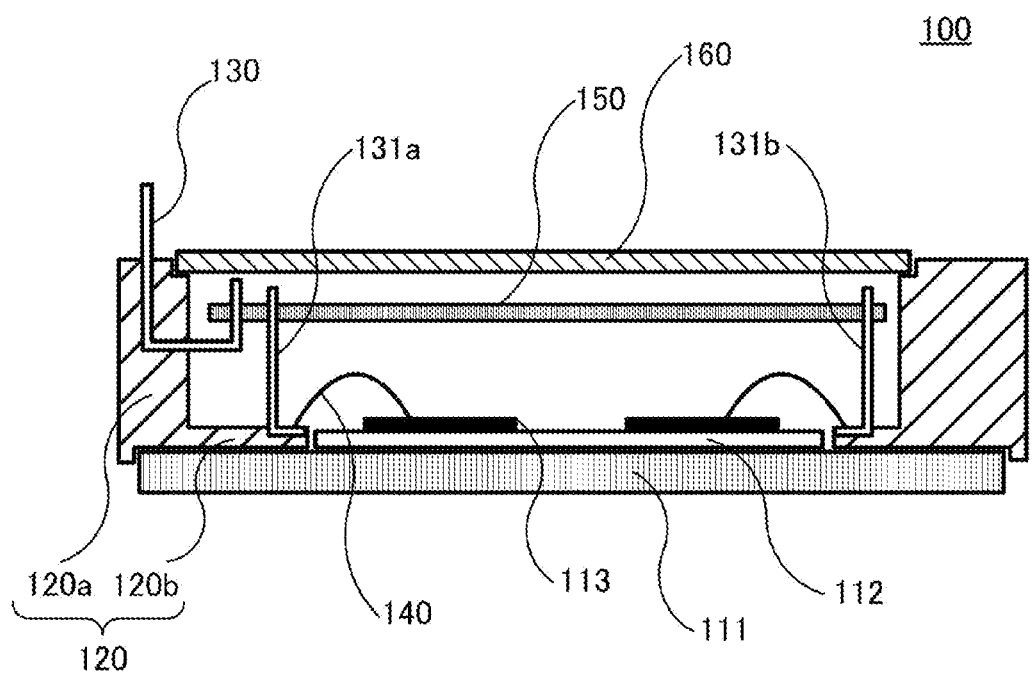
FIG. 6 is a sectional view of a semiconductor device according to a heretofore known example of the invention.
Figure 7:
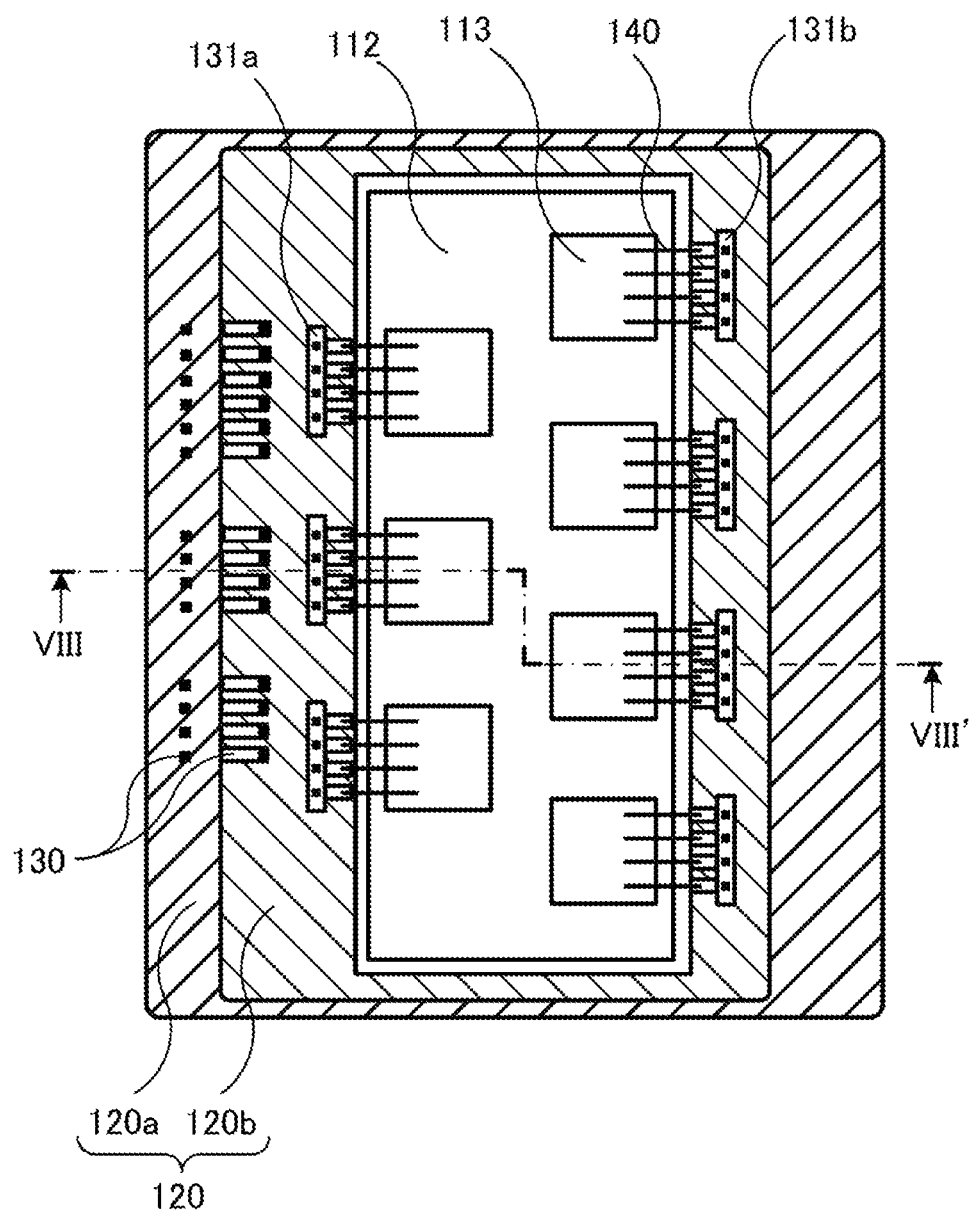
FIG. 7 is a plan view of the semiconductor device according to the heretofore known example of the invention at a manufacturing stage.
Figure 8:
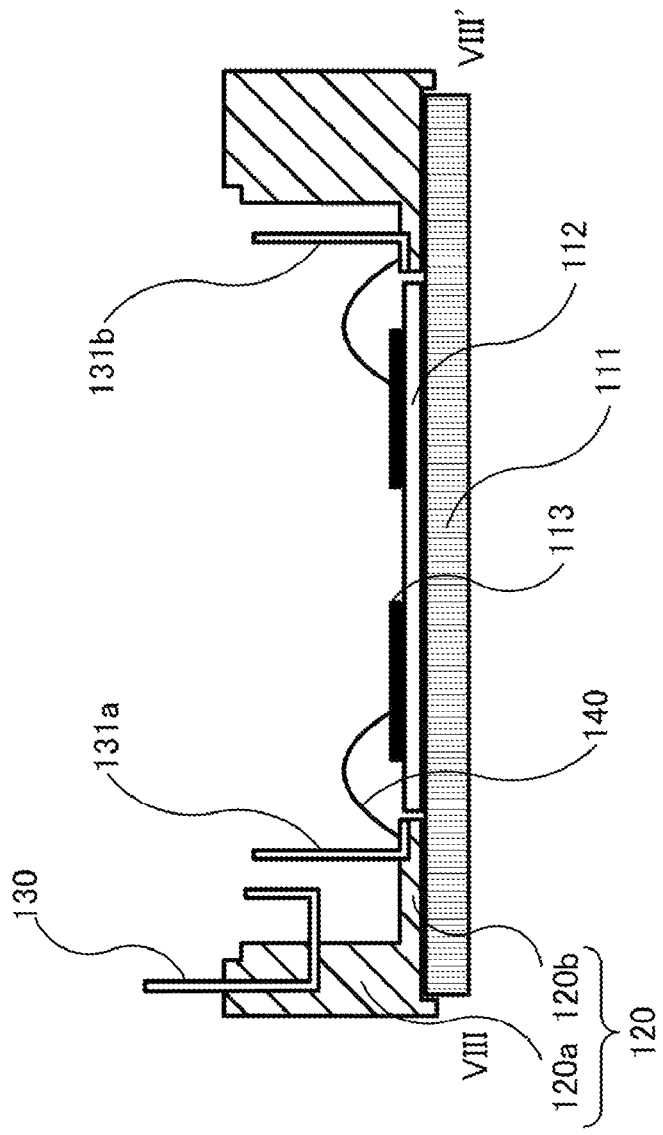
FIG. 8 is a sectional view of the semiconductor device according to the heretofore known example of the invention at the manufacturing stage.

Subsequently, a description will be given of the shape of the control terminal insertion holes 32. FIGS. 5A and 5B are each a plan view and sectional view of the control terminal insertion hole 32 according to the working example of the invention.

FIG. 5A shows a circular cylindrically shaped hole. It is effective to form the insertion holes 32 into a circular cylindrical shape or the like because it is thereby possible to easily carry out resin molding. It is necessary to make the diameter of the insertion holes 32 equal to or smaller than the diameter of the control terminals 30. FIG. 5B shows a quadratic cylindrically shaped insertion hole. It is effective to employ the quadratic cylindrical control terminals 30 because the area of contact with the inner surfaces of the holes increases, as a result of which it is possible to strengthen a holding force even using only press fitting.

It is effective to configure each control terminal insertion hole 32 into a cylindrical protruding portion such as protrudes from the surface of the case bottom portion 20b and covers the end portion of the control terminal 30, as shown in FIGS. 5A and 5B, because it is thereby easy for the control terminal insertion holes 32 to change in shape as compared with when simply providing holes in the surface of the case bottom portion 20b, and thus easy to press fit the control terminals 30 even when variation occurs in the diameters of the control terminals 30. Furthermore, the control terminal insertion holes 32 need a depth equal to or greater than a certain depth in order to enable the control terminals 30 to be held even by only being press fitted, but it is possible to reduce the thickness of the case bottom portion 20b as compare with when simply providing holes in the case bottom portion 20b. Because of this, it is possible to reduce members necessary for molding the case 20, and thus possible to contribute to a reduction in manufacturing cost.

The control terminal insertion holes 32 are configured so that the end portions of the control terminals 30 are mounted by only being press fitted, but it is also possible to mount the end portions by adding an adhesive or the like. In this case, it is possible to further strengthen the holding force as compared with when the end portions are only press fitted, which is effective in improving the long-term reliability of the IPM.

While the present invention has been particularly shown and described with reference to certain specific embodiments, it will be understood by those skilled in the art that the foregoing and other changes in form and details can be made therein without departing from the spirit and scope of the present invention.

What is claimed is:

1. A semiconductor device, comprising:
   power semiconductor elements;
   an insulating circuit substrate on which the power semiconductor elements are placed;
   a printed substrate, electrically connected to the power semiconductor elements, which has a control circuit;
   a case comprising a case sidewall and a case bottom portion and having control terminal insertion holes in the case bottom portion; and
   control terminals which electrically connect the printed substrate and an exterior of the semiconductor device, wherein
   the printed substrate is disposed on a level different from that of the insulating circuit substrate and the case bottom portion,
   the control terminals, having a linear shape, are inserted in the control terminal insertion holes and through holes of the printed substrate,
   a number of the control terminal insertion holes is larger than a number of the control terminals,
   the control terminal insertion holes are arranged at equal pitches on one side of the case bottom portion and extend across a central portion of the case bottom portion on the one side, and
   the case sidewall includes a first portion and a second portion, the first portion being closer to the control terminal insertion holes than the second portion, and being thinner than the second portion.

2. The semiconductor device according to claim 1, wherein
   the control terminals stand vertically from the case bottom portion.

3. The semiconductor device according to claim 1, wherein
   the control terminal insertion holes are configured so as to protrude from a surface of the case bottom portion and enclose one end of each control terminal.

4. The semiconductor device according to claim 1, wherein
   insertion openings of the control terminal insertion holes have a circular cylindrical structure or a quadratic cylindrical structure.

5. The semiconductor device of claim 1, wherein the control terminal insertion holes are configured so as to protrude from a surface of the case bottom portion and enclose one end of each control terminal, the one end of each control terminal being in contact with a floor of a corresponding control terminal insertion hole, and wherein the printed substrate is fixed to connecting terminals so as to be mounted spaced apart from sidewalls of the case.

* * * * *